(12) United States Patent
Lee (10) Patent No.: US 7,545,020 B2
(45) Date of Patent: Jun. 9, 2009

(54) CMOS IMAGE SENSOR AND METHOD FOR MANUFACTURING THE SAME

(75) Inventor: Joung Ho Lee, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 9 days.

(21) Appl. No.: 11/609,893

(22) Filed: Dec. 12, 2006

(65) Prior Publication Data

US 2007/0145516 A1 Jun. 28, 2007

(30) Foreign Application Priority Data

Dec. 28, 2005 (KR) .................. 10-2005-0132713

(51) Int. Cl.
*H01L 21/76* (2006.01)
(52) U.S. Cl. ................ 257/520; 257/E21.545
(58) Field of Classification Search ................ 257/510, 257/506, 508, 509, 513, 520, E21.545
See application file for complete search history.

(56) References Cited

U.S. PATENT DOCUMENTS

| 6,037,213 A | * | 3/2000 | Shih et al. | 438/253 |
| 6,090,661 A | * | 7/2000 | Perng et al. | 438/248 |
| 6,177,317 B1 | * | 1/2001 | Huang et al. | 438/263 |
| 7,279,770 B2 | * | 10/2007 | Mouli | 257/510 |
| 2004/0195600 A1 | * | 10/2004 | Rhodes | 257/292 |
| 2005/0156213 A1 | * | 7/2005 | Han et al. | 257/292 |

FOREIGN PATENT DOCUMENTS

| CN | 1641883 | | 7/2005 |
| KR | 2004060318 A | * | 7/2004 |

* cited by examiner

*Primary Examiner*—Sue A. Purvis
*Assistant Examiner*—W. Wendy Kuo
(74) *Attorney, Agent, or Firm*—Sherr & Vaughn, PLLC (57) ABSTRACT

Embodiments relate to a CMOS image sensor. In embodiments, the CMOS image sensor may include a semiconductor substrate, a photodiode, a first conduction type impurity region, a first insulating layer, a conduction layer, and a second insulating layer. The semiconductor substrate may have a trench in which a device isolation layer is to be formed. The photodiode may be formed in an active region of the semiconductor substrate, and the first conduction type impurity region may be formed in sidewalls of the trench. The first insulating layer may be formed inside the trench, and a conduction layer may be formed inside the trench and doped with second conduction type impurities. A second insulating layer may be formed inside the trench.

18 Claims, 7 Drawing Sheets

ION IMPLANTATION IN SIDEWALLS(B+, BF$_2$+)

CMOS IMAGE SENSOR AND METHOD FOR MANUFACTURING THE SAME

The present application claims priority under 35 U.S.C. 119 and 35 U.S.C. 365 to Korean Patent Application No. 10-2005-0132713 (filed on Dec. 28, 2005), which is hereby incorporated by reference in its entirety.

BACKGROUND

An image sensor may be a semiconductor device that converts an optical image into electrical signals. An image sensor may be classified into general categories of a charge coupled device (CCD) and a CMOS image sensor.

CMOS image sensors have gained popularity as a next generation image sensor. CMOS image sensors may overcome various disadvantages of the CCD.

The CMOS image sensor may sequentially detect an output of each unit pixel using MOS transistors. This may be done by providing as many MOS transistors as there are unit pixels on a semiconductor substrate using a CMOS technology that uses a control circuit and a signal processing circuit as peripheral circuits.

That is, the CMOS image sensor may provide photodiodes and MOS transistors within a unit pixel and may sequentially detect an electrical signal of each unit pixel in a switching manner, to form an image.

A CMOS image sensor will be described with reference to the accompanying drawings.

Figure 1:
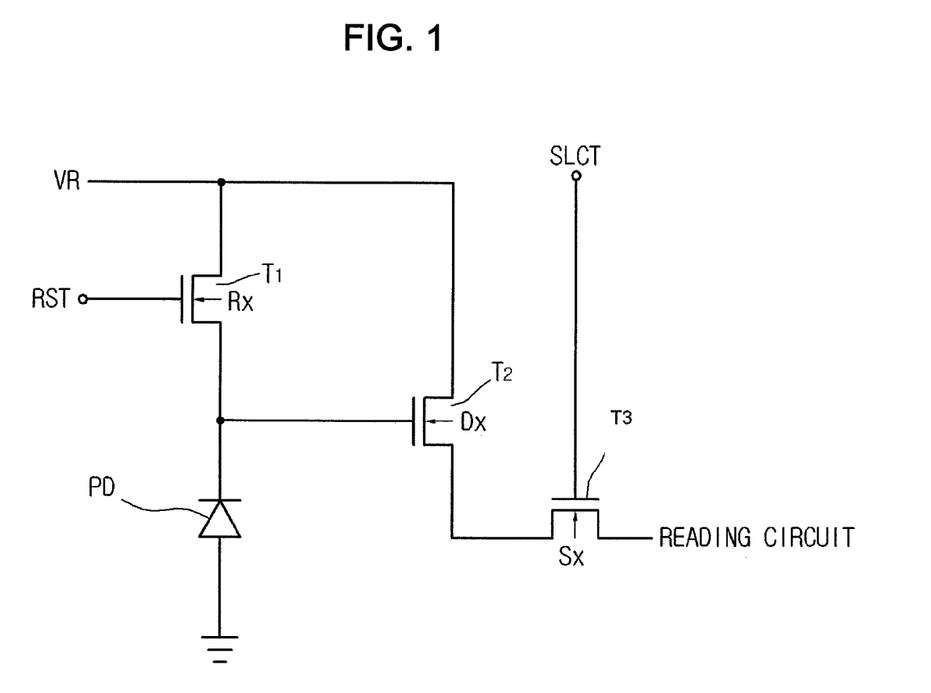
FIG. 1 is an example circuit diagram of a 3T type CMOS image sensor.

FIG. 1 is an example circuit diagram of a 3T type CMOS image sensor.

Referring to FIG. 1, a unit pixel of a 3T CMOS image sensor may include photodiode (PD) for receiving light. Photodiode PD may convert the light into an electrical signal (photo-charge). The unit pixel of the 3T CMOS image sensor may further include three nMOS transistors T1, T2, and T3 to output the photo-charge generated at photodiode PD.

For example, a cathode of photodiode PD may be connected to a drain of first nMOS transistor T1 and a gate of second nMOS transistor T2.

Sources of first and second nMOS transistors T1 and T2 may be connected to a power line through which reference power VR may be supplied. A gate of first nMOS transistor T1 may be connected to a reset line through which a reset signal RST may be supplied.

A source of third nMOS transistor T3 may be connected to a drain of second nMOS transistor T2. A drain of third nMOS transistor T3 may be connected to a reading circuit (not shown) via a signal line. A gate of third nMOS transistor T3 may be connected to a selection line, for example a heat selection line, through which a selection signal SLCT may be supplied.

First nMOS transistor T1 may be called reset transistor Rx. Second nMOS transistor T2 may be called drive transistor Dx. Third nMOS transistor T3 may be called selection transistor Sx.

Figure 2:
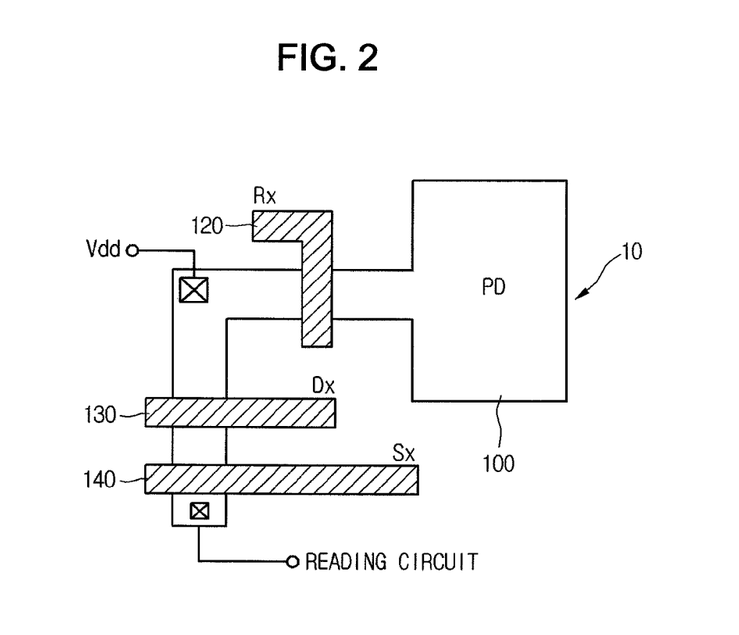
FIG. 2 is an example layout diagram illustrating a unit pixel of a 3T type CMOS image sensor.

FIG. 2 is an example diagram illustrating a layout of a unit pixel of a 3T type CMOS image sensor.

Referring to FIG. 2, a unit pixel of the 3T type CMOS image sensor may include an active region 10. Photodiode 100 may be formed on a wide portion of active region 10. Gate electrodes 120, 130, and 140 of three transistors overlapping each other may be formed on the other portion of active region 10.

That is, reset transistor Rx may be formed by gate electrode 120. Drive transistor Dx may be formed by gate electrode 130. Selection transistor Sx may be formed by gate electrode 140.

Impurity ions may be implanted in portions excluding lower portions of respective gate electrodes 120, 130, and 140 in active region 10 of each transistor. Source/drain regions of each transistor may thus be formed.

Power voltage Vdd may be applied to source/drain regions between reset transistor Rx and drive transistor Dx. Source/drain regions on one side of selection transistor $S_x$ may be connected to a reading circuit (not shown).

Although not shown in FIG. 2, gate electrodes 120, 130, and 140 may be connected to respective signal lines. Each of the signal lines may have a pad at one end and may be connected to an external driving circuit.

Three photodiodes, which may each have the above-descried construction, may constitute one pixel. For example, red, green, and blue color filters may be formed on three photodiodes, respectively, to constitute on pixel.

Photo sensitivity of the photodiode may increase as it receives a larger amount of light. Accordingly, increasing a fill factor of the photodiode may improve photo sensitivity. However, when the fill factor of the photodiode increases, a region of a driving circuit may correspondingly decrease. Therefore, there may be a limitation in increasing the fill factor of the photodiode.

Therefore, a microlens may be formed on the photodiode. It may be beneficial to improve a light-condensing efficiency of the microlens and to simply a process.

A dark current may exist in a CMOS image sensor, and may allow a photodiode to react as if it received light even in a region where there is no light. This may cause a refractory problem of generating a white pixel. That is, a white pixel may be generated due to this dark current.

This problem may be caused by an electron that may be generated in a defect existing in an upper interface of a semiconductor substrate where a photodiode may be formed. There may be a variety of methods for removing an electron having nothing to do with a signal existing in the interface.

Also, the dark current may be generated when undesired electrons are generated by an interface defect between an oxide layer of a shallow trench isolation (STI) layer and sidewalls of a photodiode.

A device isolation layer and a photodiode region in a related art CMOS image sensor will be described.

Figure 3:
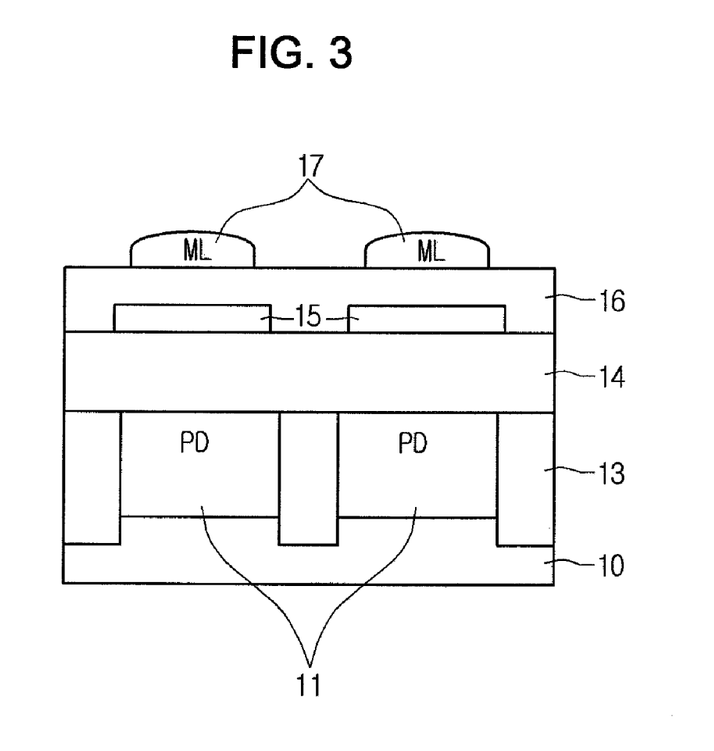
FIG. 3 is an example cross-sectional diagram illustrating a photodiode region of a related art CMOS image sensor.

FIG. 3 is an example cross-sectional view illustrating a photodiode region of a related art CMOS image sensor.

Referring to FIG. 3, a related art CMOS image sensor may include device isolation layer 13, that may be formed in a device isolation region. Device isolation layer 13 may define an active region in a p-type semiconductor substrate 10. A plurality of photodiodes 11 may be formed within the active region of semiconductor substrate 10.

Interlayer insulating layer 14 may be formed over an entire surface of semiconductor substrate 10 including photodiodes 11. A plurality of metal lines may be formed in interlayer insulating layer 14.

R, G, and B color filters 15 that may realize a color image may be formed on interlayer insulating layer 14 in an upper portion of the photodiode region. Overcoat layer 16 may be formed on an entire surface of the substrate including color filters 15. Also, microlenses 17 may be formed on overcoat layer 16 on color filters 15.

Microlenses 17 may be obtained by coating a photoresist and patterning the photoresist such that photoresist patterns are left above photodiodes 11. A desired curvature of the microlenses 17 may be obtained by performing a reflow process on the photoresist, for example through baking.

Each microlens 17 may condense and/or direct incident light to a corresponding photodiode 11.

The photodiode region will be described below in additional detail in the related art CMOS image sensor having the above-described structure.

Figure 4:
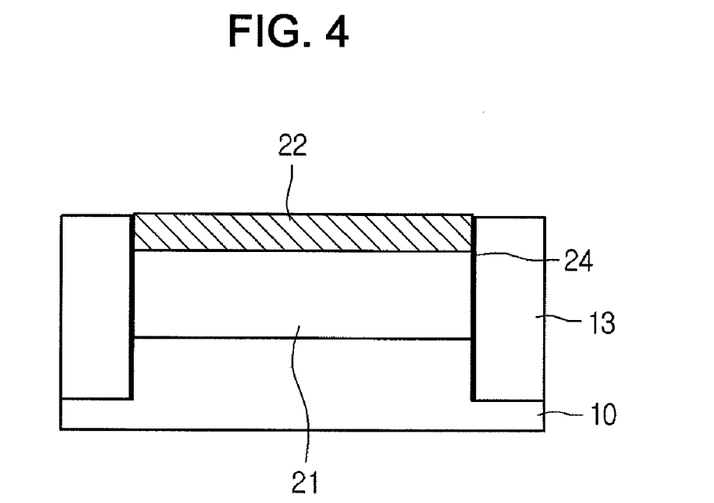
FIG. 4 is an example cross-sectional diagram of a related art photodiode region.

FIG. 4 is an example cross-sectional view of the related art photodiode region.

In general, a photodiode may have the following structure. A P-N junction may be formed so that a depletion region may be created in the P-N junction. Light may be received in the depletion region. If light is received in the depletion region, then an electron-hole pair may be created. The CMOS image sensor may only output an electron of the electron-hole pair as an image signal.

Referring to FIG. 4, in the related art CMOS image sensor, a device isolation region of a p-type semiconductor substrate 10 (that may be formed by growing a p-type epitaxial layer on a semiconductor substrate) may be etched to a prescribed depth and may form a trench. Device isolation layer 13 may be formed by filling the trench with an insulating layer, for example such as an oxide layer.

N-type impurity region 21 may be formed by implanting P or As ions in the active region. After that, p-type impurity region 22 may be formed by implanting p-type impurity ions in a surface of n-type impurity region 21.

P-type impurity region 22 may remove electrons that may be generated on a surface of semiconductor substrate 10 by forming the p-type impurity region having many holes on a surface of the semiconductor substrate. With this structure, electrons that may be created by a defect existing on a surface of semiconductor substrate 10 may move from the surface to the photodiode to generate an undesired signal. The created electrons that have moved to the photodiode may recombine with the holes of p-type impurity region 22, so that the electrons generated on a surface of semiconductor substrate 10 may be removed.

P-type impurity region 24 may be formed by implanting boron-based ions (e.g., $B^+$ or $BF^{2+}$) in sidewalls of device isolation layer 13, and may allow electrons existing on sidewalls of device isolation layer 13 to recombine with holes of p-type impurity region 24.

A method for forming p-type impurity region 24 will be described below.

Figure 5A:
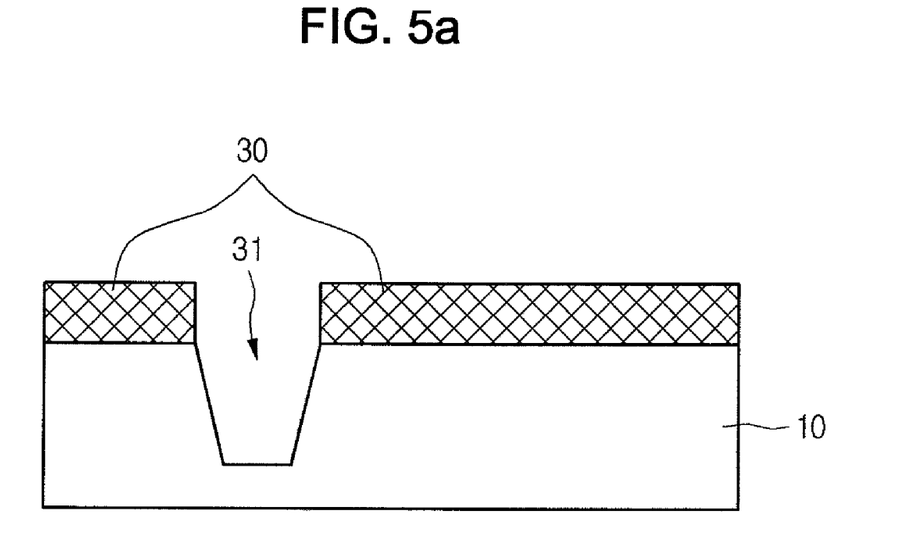
FIGS. 5A and 5B are example cross-sectional diagrams illustrating a process for forming p-type impurity region according to the related art.
Figure 5B:
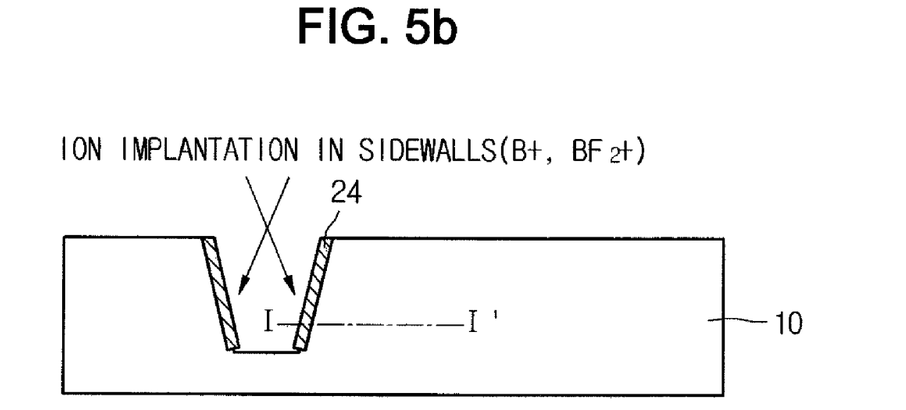

FIGS. 5A and 5B are example cross-sectional diagrams illustrating a process for forming p-type impurity region 24 according to the related art.

Referring to FIG. 5A, photoresist layer pattern 30 (or a nitride layer pattern) may be formed on the p-type semiconductor substrate 10 such that device isolation region may be exposed. The device isolation region of semiconductor substrate 10 may be etched to a prescribed depth using, for example, a reactive ion etching (RIE) process, and may form trench 31.

Referring to FIG. 5B, p-type impurity region 24 may be formed in sidewalls of trench 31, for example by implanting boron-based ions (e.g., $B^+$ or $BF^{2+}$) in sidewalls of trench 31 using tilt ion implantation. A device isolation layer may be formed by filling the trench with an insulating layer such as an oxide layer as described above.

Figure 6:
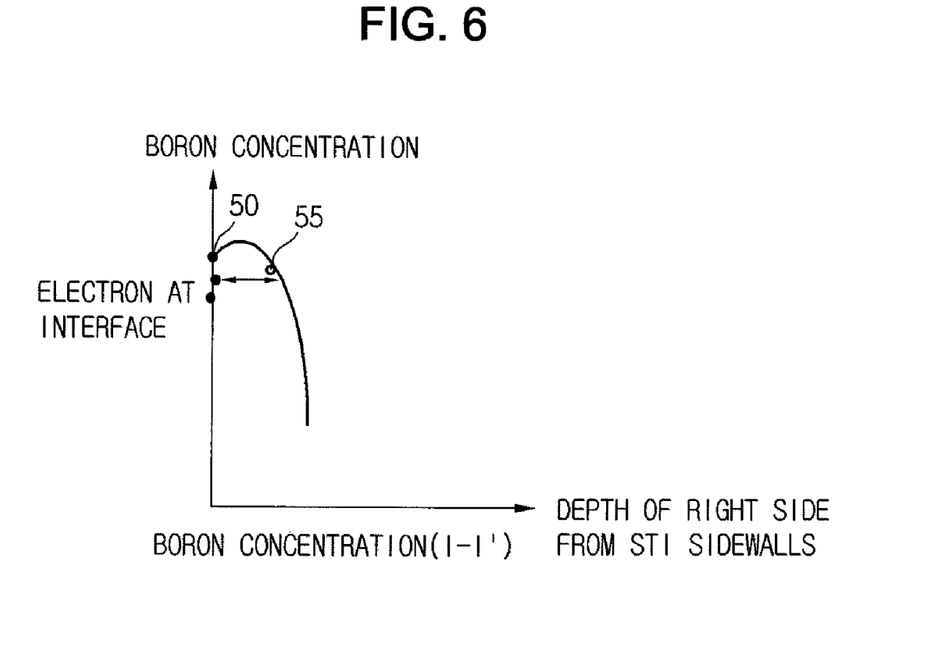
FIG. 6 is an example graph illustrating a concentration of boron measured along line I-I' of FIG. 5B.
Figure 7:
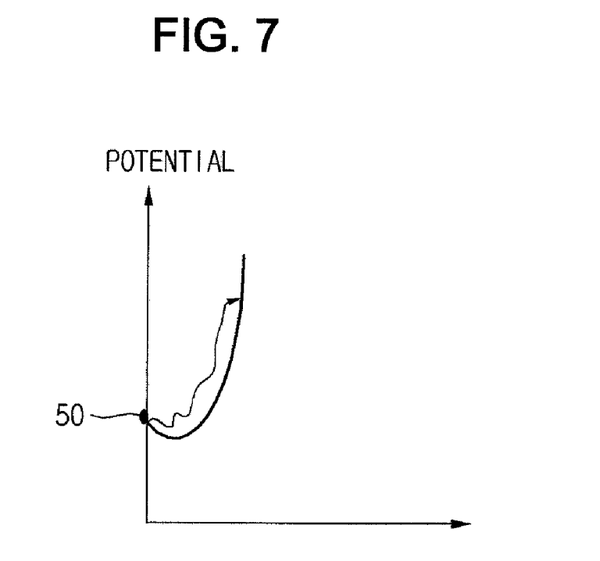
FIG. 7 is an example potential profile illustrating a problem of the related art CMOS image sensor.

FIG. 6 is an example graph illustrating a concentration of boron measured along line I-I' of FIG. 5B, and FIG. 7 is an example potential profile illustrating a problem of the related art CMOS image sensor.

P-type impurity region 24 may be formed in the sidewalls of device isolation layer 13. Electrons 50 generated by a sidewall defect of device isolation layer 13 may therefore mostly recombine with holes 55 and thus may be removed as illustrated in FIG. 6.

The above-described related art CMOS image sensor may have various problems. For example, referring to FIG. 7, since potential is high at n-type impurity region 21 of photodiode 11, a portion of electrons 50 generated by the sidewall defect of device isolation layer 13 may be dragged to the photodiode region, which may result in a high possibility of a dark current. A white pixel may be generated due to this dark current.

SUMMARY

Embodiments relate to a semiconductor device and embodiments relate to a complementary metal oxide semiconductor (CMOS) image sensor and a method for manufacturing the same.

Embodiments relate to a CMOS image sensor and a method for manufacturing a CMOS image sensor that may be capable of preventing a dark current from being generated by allowing electrons not to flow to a PD from an impurity region formed in sidewalls of a device isolation layer.

In embodiments, a complementary metal oxide semiconductor image sensor may include a semiconductor substrate having a trench in which a device isolation layer is to be formed, a photodiode formed in an active region of the semiconductor substrate, a first conduction type impurity region formed in sidewalls of the trench; a first insulating layer formed inside the trench, a conduction layer formed inside the trench and doped with second conduction type impurities, and a second insulating layer formed inside the trench.

In embodiments, a method for manufacturing a complementary metal oxide semiconductor image sensor may include forming a trench in a semiconductor substrate, forming a first impurity region in sidewalls of the trench, forming a first insulating layer inside the trench, forming a conduction layer doped with second conduction type impurities inside the trench; depositing a second insulating layer to fill the trench, planarizing the second insulating layer, and forming a photodiode in an active region of the semiconductor substrate.

DETAILED DESCRIPTION

FIGS. 8A to 8E are example views illustrating a method for forming a CMOS image sensor according to embodiments.

FIGS. 8A to 8E illustrate a process of forming an impurity region in sidewalls of a device isolation layer and sidewalls of the device isolation layer of the CMOS image sensor according to embodiments.

Basic structures of a photodiode, color filters, and microlenses in the CMOS image sensor according to embodiments are substantially similar to those of the related art. Embodiments are characterized in an impurity region formed in a device isolation layer and in sidewalls of the device isolation layer. Therefore, description of the same parts will be omitted. Only embodiments of a method for forming an impurity region in a device isolation layer and in sidewalls of the device isolation layer, and embodiments of a structure thereof will be described.

Figure 8A:
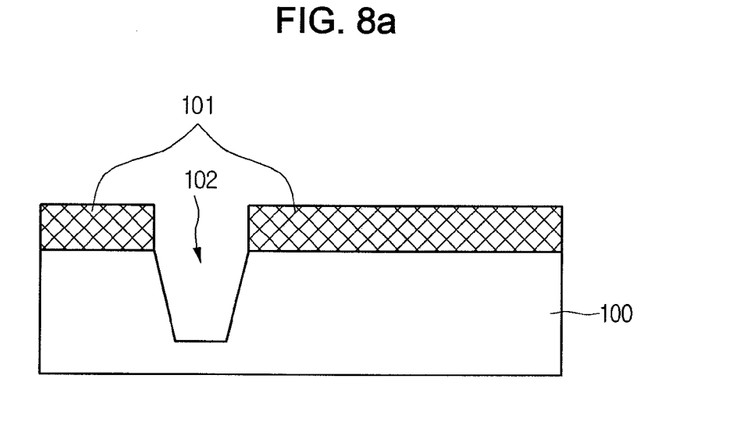
FIGS. 8A to 8E are example cross-sectional diagrams illustrating a process of forming an impurity region in a device isolation layer of a CMOS image sensor according to embodiments.

Referring to FIG. 8A, photoresist layer pattern 101 (or a nitride layer pattern) may be formed on p-type semiconductor substrate 100. The device isolation region may thereby be exposed. A device isolation region of semiconductor substrate 100 may be etched to a prescribed depth, for example using a reactive ion etching (RIE) process to form trench 102.

Figure 8B:
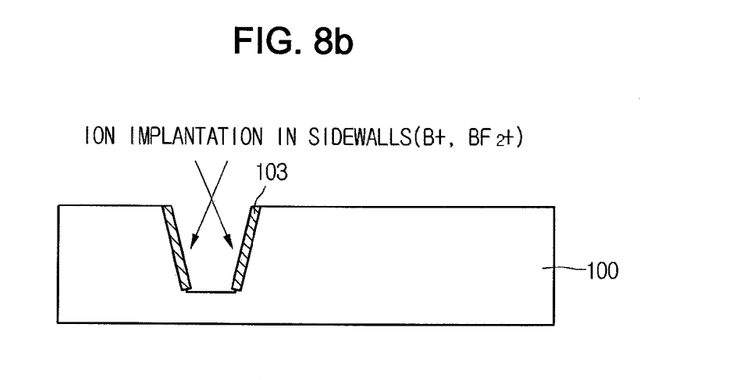

Referring to FIG. 8B, p-type impurity region 103 may be formed in sidewalls of trench 102, for example by implanting boron-based ions (e.g., $B^+$ or $BF^{2+}$) in the sidewalls of trench 102 using tilt ion implantation.

Figure 8C:
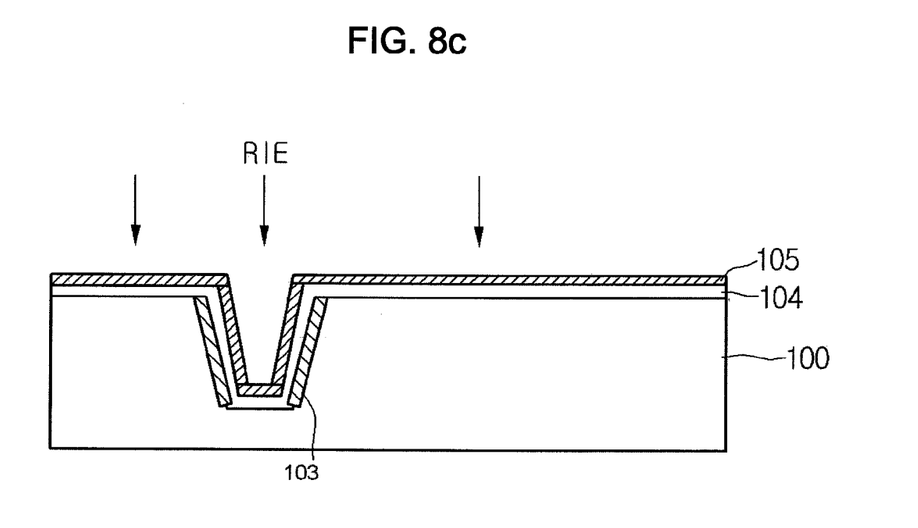

Referring to FIG. 8C, photoresist layer pattern 101 may be removed. A thermal oxide layer 104 may then be formed over a surface, for example an entire surface, of substrate 100 including trench 102. Polysilicon layer 105 may be doped with n-type impurities (e.g., As), and may be formed on thermal oxide layer 104.

In embodiments, a concentration of the n-type impurities that dope polysilicon layer 105 may be in a range of approximately $10^{18}$-$10^{19}$ atoms/cm$^3$. Excessive concentration may cause depletion in the sidewalls and may generate a leakage current flowing between devices.

Figure 8D:
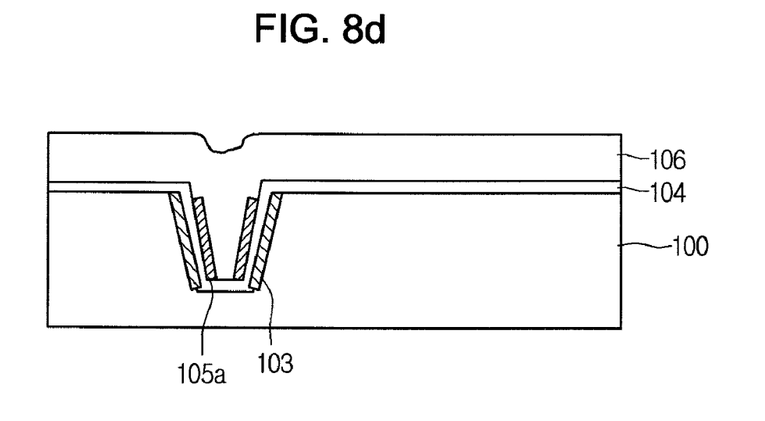

Referring to FIG. 8D, polysilicon layer 105, that may be doped with the n-type impurities, may be anisotropic-etched (e.g., RIE) to leave n-type impurity polysilicon patterns 105a on the sidewalls of trench 102.

In embodiments, a portion of polysilicon layer 105 that may be formed at a lower portion of trench 102, and a portion of polysilicon layer 105 that may be formed on thermal oxide layer 104 may be removed, for example by the anisotropic etching.

Therefore, polysilicon patterns 105a doped with the n-type impurities may be left on the sidewalls of trench 102.

Figure 8E:
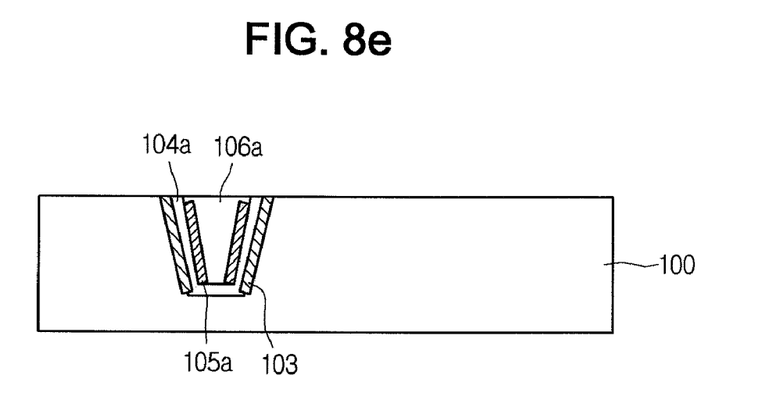

Referring to FIG. 8E, insulating layer 106, for example such as a CVD oxide layer, may be deposited on a surface, for example an entire surface, of substrate 100 including polysilicon patterns 105a doped with the n-type impurities such that trench 102 is sufficiently filled with the insulating layer 106.

Insulating layer 106 and thermal oxide layer 104 may be removed, for example using chemical mechanical polishing (CMP). Insulating layer 106 and thermal oxide layer 104 may thus be left only in the inside of trench 102. Device isolation layers 104a, 105a, and 106a may thus be formed.

N-type impurity ions may be implanted in an active region defined by the device isolation layer to form a photodiode, and an additional process of forming a p-type impurity region on a surface of the photodiode may be performed.

Figure 9:
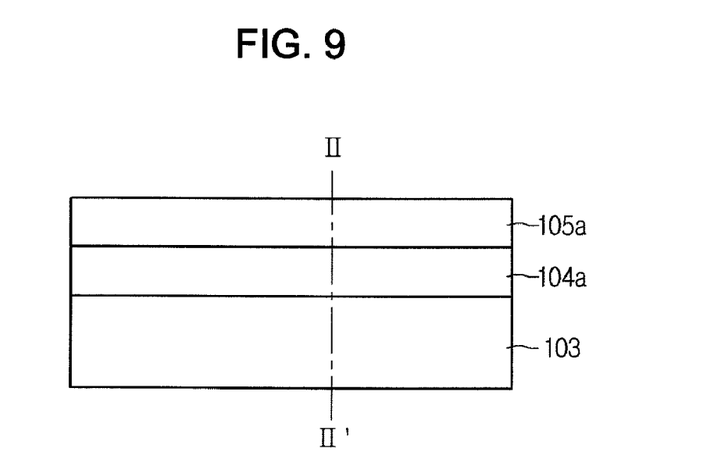
FIG. 9 is an example cross-sectional diagram of a p-type impurity region, a thermal oxide layer, and a polysilicon patterns doped with n-type impurities of FIG. 8E, according to embodiments.
Figure 10:
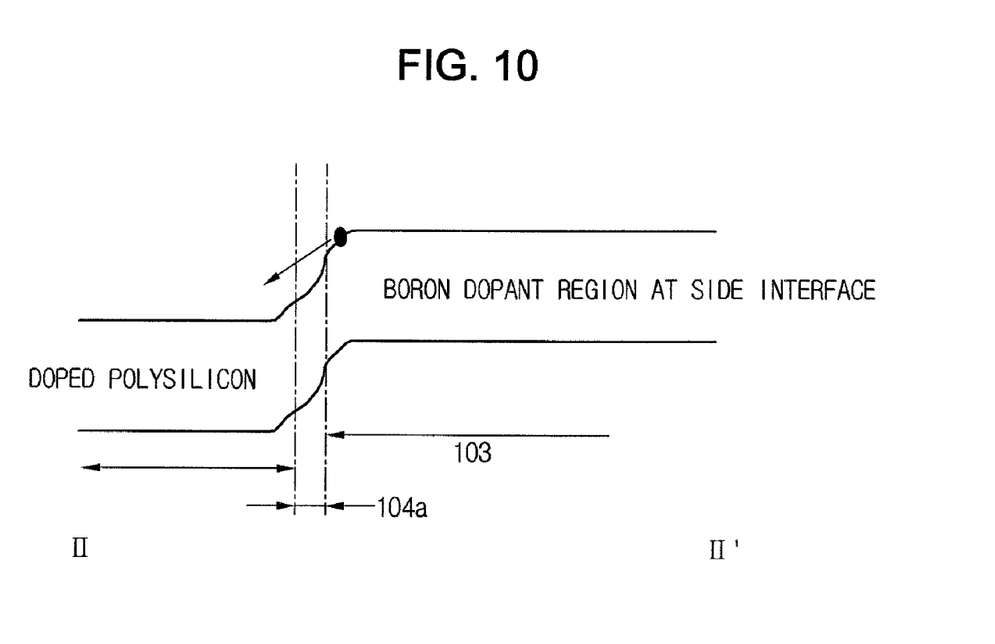
FIG. 10 is an example diagram illustrating a potential profile taken along line II-II' of FIG. 9, according to embodiments.

FIG. 9 is an example cross-sectional diagram of p-type impurity region 103, the thermal oxide layer 104a, and the polysilicon patterns 105a doped with n-type impurities of FIG. 8E, according to embodiments. FIG. 10 is a diagram illustrating a potential profile taken along line II-II' of FIG. 9, according to embodiments.

Referring to FIGS. 9 and 10, in the CMOS image sensor according to embodiments, polysilicon patterns 105a may be doped with n-type impurities and may increase potential of the sidewalls of the device isolation layer with the thermal oxide layer 104a interposed (energy of an electron decreases).

Therefore, a portion of electrons generated by a sidewall defect of the device isolation layer may not be dragged toward the photodiode region, but instead may stick on the sidewalls of the device isolation layer.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A device comprising:
   a semiconductor substrate having a trench, wherein the semiconductor substrate is doped with first conduction type impurities;
   impurity regions formed spaced apart and heavily doped with first conduction type impurities and formed in sidewalls of the trench;
   a first insulating layer formed on and contacting sidewalls of the impurity regions and also on and contacting a bottommost surface of the semiconductor substrate provided in the trench, wherein the bottommost surface of the semiconductor substrate provided in the trench is not heavily doped with the first conduction type impurities;
   conduction patterns formed spaced apart and doped with second conduction type impurities and formed at the sidewalls of the trench on a portion of the first insulating layer; and
   a second insulating layer filled in the trench,
   wherein the respective uppermost surfaces of the semiconductor substrate, the impurity regions, the first insulating layer and the second insulating layer are coplanar.

2. The device of claim 1, further comprising a photodiode formed in an active region of the semiconductor substrate.

3. The device of claim 1, wherein the conduction patterns are formed between the impurity region and the second insulating layer.

4. The device of claim 1, wherein the first insulating layer is formed between a respective impurity region and a respective conduction pattern.

5. The device of claim 1, wherein the conduction patterns are formed over a surface of the first insulating layer.

6. The device of claim 1, wherein the conduction patterns each comprise a polysilicon layer doped with As.

7. The device of claim 6, wherein the conduction patterns are patterned by removing a portion of the polysilicon layer.

8. The device of claim 1, wherein the impurity regions each comprise implanted boron-based impurity ions.

9. The device of claim 1, wherein the first conduction type impurities comprise P-type impurities and the second conduction type impurities comprise n-type impurities.

10. The device of claim 1, wherein the first insulating layer comprises a thermal oxide layer and the second insulating layer comprises an oxide layer formed by chemical vapor deposition.

11. A method comprising:
   forming a trench in a semiconductor substrate doped with first conduction type impurities;
   forming impurity regions spaced apart and heavily doped with the first conduction type impurities in sidewalls of the trench;
   forming a first insulating layer on and contacting sidewalls of the impurity regions and also on and contacting a bottommost surface of the trench, wherein the bottommost surface of the trench is not heavily doped with the first conduction type impurities;
   forming conduction patterns spaced apart and doped with second conduction type impurities at the sidewalls of the trench on a portion of the first insulating layer; and
   depositing a second insulating layer in the trench,
   wherein the respective uppermost surfaces of the semiconductor substrate, the impurity regions, the first insulating layer and the second insulating layer are coplanar.

12. The method of claim 11, further comprising forming a photodiode in an active region of the semiconductor substrate.

13. The method of claim 11, wherein the impurity regions are formed by implanting boron-based impurity ions in the sidewalls of the trench.

14. The method of claim 11, wherein forming the conduction patterns comprises:
   forming a polysilicon layer on the semiconductor substrate and the impurity region; and
   anisotropic-etching the polysilicon layer to leave a polysilicon pattern on the sidewalls of the trench.

15. The method of claim 14, wherein the polysilicon layer is doped with As.

16. The method of claim 15, wherein a doping concentration of As is in a range of $10^{18}$-$10^{19}$ atoms/cm$^3$.

17. The method of claim 14, wherein anisotropic-etching the polysilicon layer comprises removing a portion of the polysilicon layer that is formed on a lower portion of the trench.

18. The method of claim 11, wherein the first conduction type impurities comprise p-type impurities and the second conduction type impurities comprise n-type impurities.

* * * * *